United States Patent [19]
Wire

[11] Patent Number: 5,831,489
[45] Date of Patent: Nov. 3, 1998

[54] COMPACT MAGNETIC SHIELDING ENCLOSURE WITH HIGH FREQUENCY FEEDS FOR CRYOGENIC HIGH FREQUENCY ELECTRONIC APPARATUS

[75] Inventor: Michael S. Wire, Redondo Beach, Calif.

[73] Assignee: TRW Inc., Redondo Beach, Calif.

[21] Appl. No.: 715,944

[22] Filed: Sep. 19, 1996

[51] Int. Cl.⁶ .............................. H01L 39/00; H05K 5/04; H05K 9/00
[52] U.S. Cl. ................... 333/99.008; 333/247; 361/728; 174/52.1; 257/728
[58] Field of Search ..................................... 333/247, 246, 333/99 S; 257/664, 659, 699, 685, 716, 728; 361/728; 174/52.1; 505/210, 700, 701, 866

[56] References Cited

U.S. PATENT DOCUMENTS

| | | |
|---|---|---|
| 4,831,211 | 5/1989 | McPherson et al. ................ 174/52.1 X |
| 5,052,183 | 10/1991 | Koscica et al. .................... 333/99 S X |

FOREIGN PATENT DOCUMENTS

| | | | |
|---|---|---|---|
| 51605 | 3/1984 | Japan .............................. 333/202 DR |
| 9121986 | 7/1984 | Japan ..................................... 257/716 |
| 255102 | 9/1986 | Japan .................................. 333/219.1 |

OTHER PUBLICATIONS

Mager, "Magnetic Shields", IEEE Transactions on Magnetics vol. MAG–6, No. 1, Mar. 1970 pp. 67–74.
Mager, "Magnetic Shielding . . . Field", J. Appl. Phys. vol. 39 10/67 pp. 1914, 1919.
Wolf Gubser & Cox, "Shielding of . . . Material" Rev. Sci. Instrum. 50(6) Jun. 1979, pp. 751–756, Amer. Inst. Physics.

Primary Examiner—Benny T. Lee
Attorney, Agent, or Firm—Michael S. Yatsko

[57] ABSTRACT

Operating high frequency cryogenic superconductor devices requires an enclosure that permits application of wide band RF signals from an external source to the superconductor device while maintaining the device at cryogenic temperatures in an essentially magnetic field free environment. A magnetic field shielding enclosure is formed of inner (5, 7) and outer (9, 11) mumetal containers, one larger than the other in size. Each of those containers is formed of two open-ended container like pieces that are nested together with overlapping side walls to define two generally closed regions, the first containing the cryogenic superconductor device (1) and the second (9, 11) containing the first container (5, 7). A shielded high bandwidth transmission line (12), sufficiently compliant physically, is snaked through slight clearance spaces between the pieces of each of those containers to the superconductor device. Suitably the shielded transmission line is formed of materials having a thermal conductivity less than the thermal conductivity of the metal copper.

26 Claims, 1 Drawing Sheet

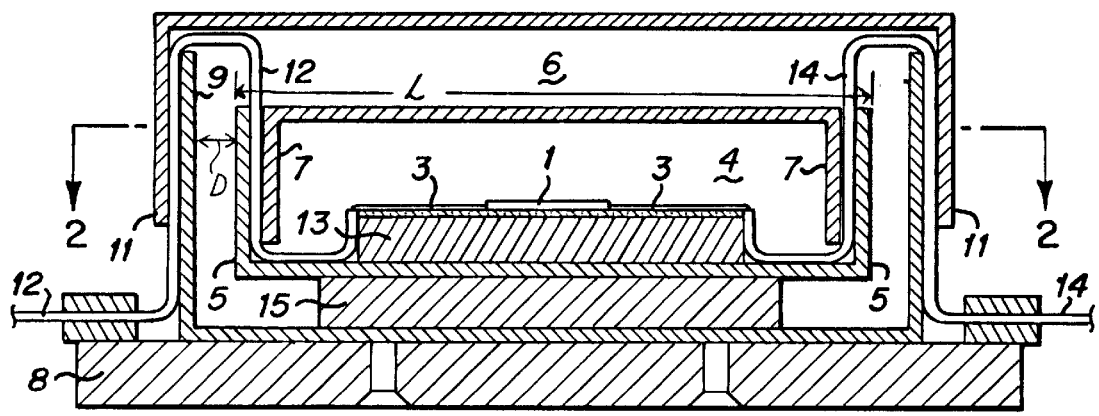
Fig. 1
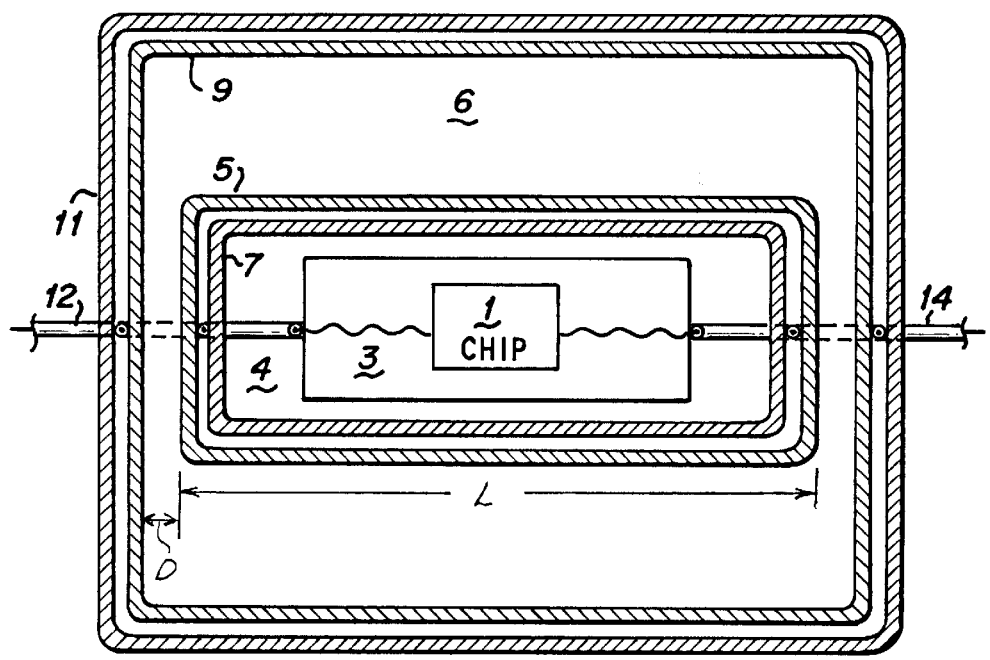
Fig. 2
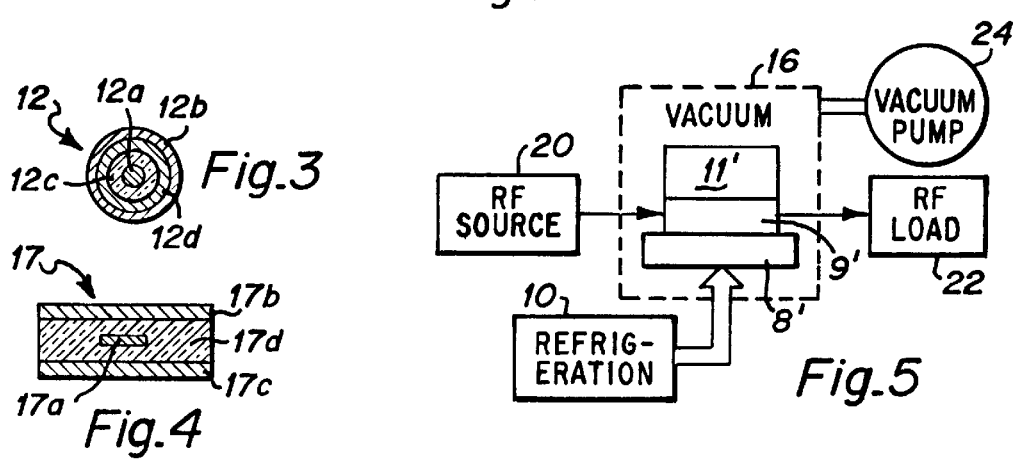
Fig. 3
Fig. 4
Fig. 5

COMPACT MAGNETIC SHIELDING ENCLOSURE WITH HIGH FREQUENCY FEEDS FOR CRYOGENIC HIGH FREQUENCY ELECTRONIC APPARATUS

STATEMENT OF GOVERNMENT SUPPORT

This invention was developed during the course of Contract or Subcontract No. N00014-91-C-0198 for the Department of Defense. The government has certain rights in this invention.

FIELD OF THE INVENTION

This invention relates to electronic cryogenic apparatus and, more particularly, to housing and associated high frequency transmission line feed structure for operating cryogenic high frequency electronic apparatus in a magnetic field free region without introducing deleterious thermal conducting paths. The invention allows wide band RF signals to be routed to and from the electronic apparatus while maintaining the compact size inherent in a magnetically cascaded shielding enclosure.

BACKGROUND

Superconducting electronics and other known electronics circuits that are required to be maintained at very low "cryogenic" temperatures in order to properly function, are referred to as cryogenic electronic devices. Many such cryogenic electronic devices are sensitive to magnetic fields. In operation they must be magnetically shielded to prevent exposure to stray magnetic fields, such as may be generated by other nearby apparatus and even by the Earth's magnetic field. With most other electronics devices the affect of the Earth's magnetic field is of minimal significance and is disregarded. That is not the case with the electronic devices with which the present invention is concerned.

Superconducting SQUID circuits, as example, requires a low magnetic field environment, an environment with little or no magnetic fields, either static (DC) or low frequency fields.

To obtain an acceptable magnetic "flux free" environment requires at least two magnetic shields, that are cascaded. That is, one shielding enclosure that is used to enclosed the cryogenic device is, in turn, enclosed within a larger second shielding enclosure, and the dimensional relationship between the two enclosures is such that the first enclosure blocks entry of stray magnetic fields and the second enclosure blocks entry of any remaining stray magnetic field that penetrates the first shielding enclosure. Those magnetic shields are formed of mumetal, a metal alloy having a high magnetic permeability, typically in excess of 1,000 and a low coercive force. That alloy contains Nickel and Iron with small amounts of Chromium, Copper, Molybdenum or Manganese. Prior to operation, the shields are degaussed to eliminate any remnant magnetic field in the metal resulting from exposure to the Earth's magnetic field or from anything else, a customary practice.

Mumetal is satisfactory for this purpose since such material possesses the characteristic of having a high magnetic permeability at cryogenic temperatures. Known mumetal materials are marketed and sold commercially under the brand names VACOPERM 100, PERMENORM 5000 H3, TRAFOPERM 2, and AD-Mu-80. A discussion of cascaded magnetic shields is further described in the technical literature, see the article "Magnetic Shields", Mager, *IEEE Transactions on Magnetics,* Vol. MAG-6, No. 1, March 1970, pp 67–74 and also "Magnetic Shielding Efficiencies of Cylindrical Shells with Axis Parallel to the Field", Mager, *J. Appl. Phys.,* Vol. 39, page 1914, 1968.

Others have presented magnetically shielding containers heretofore for cryogenic devices. Those enclosures are formed of concentric mumetal cylinders or shells, one located within the other, with tubular passages formed in the non-cylindrical side walls or end forming a passage through such shells to allow the electrical transmission lines access to the enclosed cryogenic device, see "Shielding of longitudnal magnetic fields with thin, closely spaced cylinders of high permability material", Gubser, Wolf and Cox, *Rev. Sci. Instrum.* 50(6) June 1979, pp 751–756, published by the American Institute of Physics. The foregoing structure results in a shielding enclosure that is larger in size than desired. The requirement for end passages that necessarily penetrates through the magnetic shielding material, a discontinuity, in order to bring an RF signal to the cryogenic device degrades the performance of the shield.

OBJECTS OF THE INVENTION

Accordingly, an object of the invention is to feed high bandwidth signals into and out of a magnetically shielded cryogenic environment.

A further object of the invention is to pass high frequency signals into and out of a mumetal magnetic shield without degrading the magnetic shielding and without degrading signal integrity.

A still further object of the invention is to provide a new magnetically shielded enclosure structure that permits passing high frequency signals associated with a cryogenic circuit device within the enclosure without degrading the magnetic shielding and without degrading signal integrity and that exhibits a more compact size than enclosures of similar application.

And, an additional object of the invention is to bring high frequency signals from a room temperature environment into a cryogenic environment without simultaneously conducting a significant amount of heat into the cryogenic environment as would impose an undue load to the cryogenic cooling system.

SUMMARY OF THE INVENTION

In accordance with the foregoing objects and advantages, the present invention is characterized by a magnetic field shielding enclosure that is formed of inner and outer containers, one larger than the other in size, each of which is formed of a high permeability metal, such as mumetal. Each of those containers is formed of two open-ended container like pieces that are nested together with overlapping side walls to define two generally closed regions, the first containing the cryogenic circuit device and the second containing the first container. A shielded high bandwidth transmission line, sufficiently compliant physically, is snaked through slight clearance spaces between the pieces of each of those containers to the superconductor device. Suitably shielded transmission line is formed of materials having a thermal conductivity less than the thermal conductivity of the metal copper, or very thin copper, or a combination of both thin copper and low thermal conductivity metals.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

BRIEF DESCRIPTION OF THE DRAWINGS

In the drawings:

FIG. 1 illustrates an embodiment of the invention in a side section view;

FIG. 2 illustrates the embodiment of FIG. 1 in a partial top section view taken along the lines 2—2 in FIG. 1;

FIG. 3 is a section view of a coaxial line used in the embodiment of FIGS. 1 and 2;

FIG. 4 is a section view of a microwave strip line which, in an alternative embodiment, may be substituted for the coaxial line of FIG. 3;

FIG. 5 is a block diagram showing the embodiment of FIGS. 1 and 2 as prepared for operation in a cryogenic system.

DETAILED DESCRIPTION OF THE PREFERRED EMBODIMENTS

Reference is made to FIG. 1 of the drawings, illustrating an embodiment of the invention in section view and to FIG. 2 illustrating a partial top section view of the embodiment of FIG. 1 taken along the line 2—2. The two views of the embodiment may for convenience be considered simultaneously. In FIGS. 1 and 2, a cryogenic electronic device or chip 1, is shown mounted beside a printed circuit board 3. Those elements are illustrated only to assist in understanding the operation of the invention, later herein described, and does not form a part of the new combination. Likewise, flat metal plate 8, in FIG. 1, forms a part of a cryogenic cooling system, shows the manner in which cooling is applied and is not a part of the new combination.

The embodiment of FIG. 1 includes four open ended rectangular shaped containers 5, 7, 9 and 11 that are formed of mumetal, a high permeability material, such as AD-Mu-80 mumetal, a shielded electrical transmission line 12, suitably coax line, that is snaked between the side walls of the nested containers to an input terminus for the cryogenic device 1, and a second like shielded transmission line 14, extends from an output terminus on the cryogenic device and is snaked between the side walls of those containers to the exterior. The portions of the transmission lines 12 and 14 that are omitted due to the particular section view taken in FIG. 2 are illustrated by dash lines to assist in understanding the structure.

The containers are arranged into two pairs, with containers 5 and 7 forming one pair and containers 9 and 11 forming the second pair. In each pair the containers are nested together in inverted relationship to form a confined region. Thus container 7, which is of the same geometry as container 5, and slightly smaller in size, is inverted and fits or nests within the open end of container 5, positioned upright, so that the side walls of container 7 are alongside and are overlapped by the side walls of container 5. The size relationship is such that a slight clearance space is formed between the two side walls of the nested containers, sufficient to permit insertion of the transmission line. Preferably, the ratio of the overlap of the side walls of the nested container to the clearance space(s) is twenty or greater, the specifics depending upon the requirements of the application. The internal region defined by the two nested containers is indicated as 4.

Containers 9 and 11 are larger in size than the foregoing two containers. This leaves a considerable space between the outer surface of the side wall of container 5 and the inner surface of the side wall of container 9, about the outer periphery of container 5. In this second pair, container 9 is positioned upright and container 11, which is like container 9 in geometry and slightly larger in size, is inverted and fits over or caps the open end of container 9. This allows container 9 to nest within container 11 with the side walls of container 11 positioned alongside the outer surface of the side walls of container 9 and overlaps a large portion of the latter side walls. The size of container 11 is sufficiently greater than container 9 as to allow a slight clearance between the side walls of the two containers, sufficient to allow insertion of the transmission line. The latter two containers define an internal region 6. As shown, the end wall of container 11 is elevated slightly over the end edge of the side walls of container 9 by transmission lines 12 and 14, later herein described.

The size relationship between the two pairs of containers is selected so that the spacing between the outer wall surfaces of container 5 and the inner wall surface of container 9 is sufficient to enable the pairs of containers to function as cascaded shields. More specifically the ratio of the length, L, of the longest side wall of container 5 relative to the spacing, D, between the walls of containers 5 and 9, should be much smaller than 20, ie. L/D is much smaller than 20.

A pedestal 13 formed by a flat rectangular shaped aluminum plate is seated on the end wall of container 5. The flat upper surface of that pedestal supports the cryogenic electronic device 1 in an elevated position within region 4. Another pedestal 15, also formed of a flat rectangular shaped aluminum plate, is seated on the flat end wall of container 9 and supports the first pair of containers 5 and 7 and, hence, the elements enclosed therein in an elevated position within the larger region 6.

Both mumetal and aluminum are thermal conductors. In this combination a thermally conductive path is formed from the cryogenic electronic device 1 through pedestal 13, the bottom or end wall of container 5, pedestal 15, and through the bottom or end wall of container 9 to the bottom surface of the latter end wall. The end wall of container 9 thus serves as a convenient location at which to apply cryogenic coolant or other application of a source of cold temperature.

In operation, a source of coolant 10, represented in the block diagram of FIG. 5, capable of providing cryogenic temperatures, such as within the range of four to two-hundred degrees Kelvin, is coupled to a flat aluminum plate 8', on which container 9' is seated. That coolant source sinks any heat at the cryogenic device via the described thermally conductive path.

Preferably, the electrical transmission lines 12 and 14 are formed of materials that are pliant or bendable, as variously termed, as allows bending into the desired circuituitous or, as variously termed, serpentine shape illustrated in FIG. 1. Those transmission lines are also constructed with electrical conductors that have a low thermal conductivity characteristic, much less than that of copper or at least less than that of a conventional copper cable. The transmission line may also be sufficiently flexible in characteristic to allow the transmission line to return to a conventional straight shape after disassembly of the shields while retaining the serpentine shape under the weight and frictional force of the shields as assembled. An example of the latter, is the available coaxial line marketed as UT-20-SS-SS.

Stipline flex cable is another possible example. Alternatively, the transmission line may be permanently formed to the serpentine shape.

As illustrated in FIG. 1, transmission line 12 extends from the outside of container 11 and along the side wall of container 9, and into the clearance space between said side walls of containers 9 and 11, over the open end of container 9 over to container 5, and down along the clearance space between the side walls of containers 5 and 7, and along the bottom end wall of container 5; and then up into the open end of container 7 and up along side of pedestal 13 to cryogenic high frequency electronic superconducting circuit 1. This routing allows coupling of high clock rate digital signals or RF to the high frequency electronic superconducting device and a high frequency source 20 (FIG. 5) external of the enclosure without adversely affecting the magnetic shielding and without introducing significant heat to the vicinity of said high frequency electronic superconductor apparatus from locations external of said second formed housing member.

A like routing is provided for transmission line 14, which allows coupling of high clock rate digital signals or RF from the high frequency cryogenic electronic superconductor apparatus and to an electrical load located external of the enclosure, also without affecting the magnetic shielding and without conducting significant heat from locations external of said second housing to the vicinity of said high frequency electronic superconductor apparatus.

In a first embodiment, transmission lines 12 and 14 are coaxial lines suitable for transmission of RF frequencies. In a second embodiment microwave strip line is used for that purpose. As shown in section in FIG. 3, the coaxial transmission line 12 is a cylindrical shaped line formed of an axially extending cylindrical center conductor 12a, ensheathed in a cylindrical conductor 12b and electrically insulated therefrom by an encased dielectric material 12c, with the elements formed into an integral assembly. These lines are sufficiently pliable and can be bent and formed into loops.

As one practical example, coaxial line 12 is commercially available as designation UT-20-SS-SS coax. It is a semi-rigid line, that is bendable. That coaxial line is of a 20 mil outer diameter and a 3.0 mil center lead. Both electrical conductors are formed of non-magnetic stainless steel, which has a lower thermal conductivity characteristic than copper, which is used for most other transmission lines. And of course the dielectric material has a much lower thermal conductivity than any metal. In one practical example the length of container 11 of FIG. 1 was 2.33 inches and the height of the assembled housing with coaxial lines 12 and 14 installed was just under one inch, 0.973 inches. The clearance spacing was 0.04 inches, which was ample for the coaxial line to pass.

As illustrated in section in FIG. 4, the microwave strip line 17 is formed of a central ribbon like conductor 17a, a narrow rectangle in section, bounded by two ribbon like conductors 17b and 17c, a wide rectangle in section, one on each side of conductor 17a and equally spaced therefrom. Each of conductors 17b and 17c is significantly wider than conductor 17a and the conductors are held in spaced relationship electrically insulated from each other by a fill of solid dielectric material 17d. The conductors in this strip line may also be formed of non-magnetic stainless steel or other low thermal conductivity metals.

Both coaxial lines and microwave strip lines are electrically shielded transmission lines. It is recognized that mumetal from which the containers are formed is absorptive to high frequency signals. The electrical shielded type transmission line avoids the signal losses as would otherwise occur from signal absorption by the mumetal with concurrent degradation of the RF signals.

Reference is made to the block diagram of FIG. 5, illustrating the use of the described embodiment in operation. In operation the housing assembly 11', containing the installed cryogenic electronic device, is installed atop cooling plate 8' and the assembly is covered by a vacuum housing 16. The RF coupling to the RF source 20 is connected to the assembly via suitable vacuum feed-through connectors, not illustrated, and the RF output coupling to RF load 22 is made from that assembly, also via vacuum feed-through connectors, not illustrated. Vacuum pump 24 is operated and evacuates the region within vacuum housing 16. The cryogenic refrigeration source 10 is operated and applies coolant to plate 8', which as earlier described cools the enclosed cryogenic device to the low temperatures required.

The cryogenic device operates successfully. It is found that the load on refrigeration source 10 is not significantly increased due to any thermal conduction through the RF input and output leads; the RF applied to the cryogenic device is appropriate in level and the output RF measures proper levels. The foregoing demonstrates that the cryogenic device is effectively isolated from the Earth's magnetic field and that RF signal losses of any significance are entirely avoided.

Clearance gaps of approximately 0.04 inches are allowed between the overlapping walls of the respective nested boxes and proved satisfactory to provide an accessible routing for the transmission line without introducing gaps sufficient in size to allow magnetic fields to enter the internal region within the box from outside.

The foregoing embodiment employs only one transmission line for inputting high frequency signals, such as high clock rate digital signals, RF, or any other electrical signals, and another one for outputting those high frequency signals. It is appreciated that additional transmission lines both for inputting and outputting RF may be added to the combination as necessitated by the requirements of the particular cryogenic electronic device housed.

The container members 5, 7, 9 and 11 in the foregoing embodiment are rectangular in shape. As those skilled in the art recognize upon reading this specification, alternative shapes may be selected for the nested mumetal containers so long as the small clearances are available for the shielded transmission lines. As example, the containers may be cylindrical in shape if desired.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. Apparatus for magnetically shielding cryogenic high frequency electronic superconductor apparatus within a cryogenic environment isolated from exposure to stray magnetic flux originating external of said housing, said cryogenic high frequency electronic superconductor apparatus requiring input of high frequency signals from an external source and output of high frequency signals to an external sink, comprising:

first open-ended container means having a predetermined geometry and a first predetermined size, side walls, an end wall integrally joined to said side walls and an open end located opposite said end wall;

first pedestal means of a first predetermined height for seating said high frequency electronic superconductor apparatus in spaced relationship to said end wall of said first open-ended container means;

said first pedestal means being located inside of said first open-ended container means and seated atop said end wall thereof in spaced relationship to said side walls thereof;

said first pedestal means defining a thermally conductive metal for providing a thermal conducting path between said high frequency electronic superconductor apparatus and said end wall of said first open ended container means;

second open-ended container means having said predetermined geometry of said first open-ended container means and being of a second predetermined size, side walls, an end wall integrally joined to said side walls thereof, and an open end located opposite said end wall thereof; said second predetermined size being smaller than said predetermined size of said first open-ended container means;

said second open-ended container means being nested within said first open-ended container means and in spaced relationship thereto to define therewith a first housing member for enclosing and magnetically shielding said high frequency electronic superconductor apparatus and defining a slight clearance space between said first and second open-ended container means;

said side walls of said second open-ended container means being received within said first open-ended container means and said side walls of said first open-ended container means covering and spaced from said side walls of said second open-ended container means;

third open-ended container means having a predetermined geometry and third predetermined size, side walls, an end wall integrally joined to said side walls thereof, and an open end located opposite said end wall thereof;

said third predetermined size of said third open-ended container means being larger than said first predetermined size of said first open-ended container means;

second pedestal means of a second predetermined height for supporting said end wall of said first open-ended container means on and in spaced relationship to said end wall of said third open-ended container means, said second pedestal means being in contact with an underside of said first open-ended container means end wall, on a side opposite to said end wall side on which said first pedestal means is seated;

said second pedestal means being located inside said third open-ended container means, and being seated atop said end wall thereof and in spaced relationship to said side walls of said third open-ended container means;

said second pedestal means being comprised of a thermally conductive metal for providing a thermal conducting path between said end wall of said first open-ended container means and said end wall of said third open-ended container means;

fourth open-ended container means having said predetermined geometry of said third open-ended container means and being of a fourth predetermined size, side walls, an end wall integrally joined to said side walls thereof and an open end located opposite said end wall thereof;

said fourth predetermined size of said fourth open-ended container means being larger than said third predetermined size of said third open-ended container means, wherein said fourth open-ended container means fits over said third open-ended container means;

said fourth open-ended container means being oriented in inverted position in overlying nested relationship with said third open-ended container means to define a second housing member for enclosing and magnetically shielding said first housing member and defining a slight clearance space between said fourth and third open-ended container means;

said side walls of said fourth open-ended container means covering at least a portion of and spaced from said side walls of said third open-ended container means;

cryogenic cooling means having a cryogenic temperature providing a thermal conducting path to an underside of said end wall of said third open-ended container means for withdrawing heat there through, whereby said high frequency electronic superconductor apparatus is maintained at cryogenic temperatures through heat withdrawn through said first pedestal, said end wall of said first open-ended container means, said second pedestal and said end wall of said third open-ended container means;

each of said first, second, third and fourth open-ended container means being comprised of a mu-metal, said mu-metal having high magnetic permeability characteristic and being thermally conductive, whereby said second housing member magnetically shields said first housing member from any stray magnetic fields external of said second housing member and said first housing member magnetically shields said high frequency electronic superconductor apparatus from stray magnetic fields external of said first housing member to thereby define cascaded magnetic shields;

first electrically shielded electrical transmission line lead means for propagating high frequency signals between said high frequency electronic superconductor apparatus and the external source of high frequency signals;

said first electrically shielded electrical transmission line lead means defining a serpentine path extending from outside said second housing member, from the end wall of said third open-ended container means along an outer surface of a side wall of said third open-ended container means, and into said clearance space between said side wall of said third open-ended container means and said fourth open-ended container means, over said open end of said third open-ended container means and through a clearance space between said third open-ended container means and said first open-ended container means, and down along a clearance space between said side walls of said first and second open-ended container means, and along said end wall of said first open-ended container means; and then into said open end of said second open-ended container means and up along the side of said first pedestal means to said cryogenic high frequency electronic superconductor apparatus; whereby high frequency signals are coupled between said high frequency electronic superconductor apparatus and a location external of said second housing member without adversely affecting the magnetic shielding and without introducing significant heat to the vicinity of said high frequency electronic superconductor apparatus from locations external of said second housing member.

2. The invention as defined in claim 1, wherein said first electrically shielded electrical transmission line lead means comprises first and second electrical conductors having a thermal conductivity coefficient that is less than the thermal conductivity coefficient associated with copper and a dielectric material having a low thermal conductivity characteristic for insulating said electrical conductors from one another.

3. The invention as defined in claim 1, wherein said high frequency electronic superconductor apparatus includes an input for receiving high frequency signals and wherein said electrically shielded electrical transmission line lead means couples high frequency signals to said input.

4. The invention as defined in claim 3, further comprising:
second electrically shielded electrical transmission line lead means for propagating high frequency signals between said high frequency electronic superconductor apparatus and the external source of high frequency signals;
said second electrically shielded electrical transmission line lead means being located on a side of said third open-ended container means opposite to the side at which said first electrical transmission line lead means is located;
said second electrically shielded electrical transmission line lead means comprising electrical conductors having a thermal conductivity coefficient that is less than the thermal conductivity coefficient associated with copper and dielectric material having a low thermal conductivity characteristic insulating said electrical conductors;
said second electrically shielded electrical transmission line lead means defining a serpentine path extending from outside said second housing member, from the end wall of said third open-ended container means along an outer surface of a side wall of said third open-ended container means, and into said clearance space between said side wall of said third open-ended container means and said fourth open-ended container means, over said open end of said third open-ended container means and a clearance space between said third open-ended container means and said first open-ended container means, and down along said clearance space between said side walls of said first and second open-ended container means, and along said end wall of said first open-ended container means; and then along said first pedestal means into said open end of said second open-ended container means and to said high frequency electronic superconductor apparatus; whereby high frequency signals are coupled from said high frequency electronic superconductor apparatus and propagates to a location external of said second housing member without adversely affecting the magnetic shielding and without conducting significant heat from locations external of said second housing member to the vicinity of said high frequency electronic superconductor apparatus.

5. The invention as defined in claim 4, wherein said high frequency electronic superconductor apparatus includes a high frequency signal output and wherein said second electrically shielded electrical transmission line lead means is connected to said high frequency signal output.

6. The invention as defined in claim 4, wherein said first and second electrically shielded electrical transmission line lead means are flexible and pliant in characteristic.

7. The invention as defined in claim 1, wherein said first electrically shielded electrical transmission line lead means comprises:
a coaxial line having a center conductor and an outer conductor; said center conductor having a thermal conductivity characteristic less than the thermal conductivity coefficient associated with copper, and said outer conductor having a thermal conductivity characteristic less than the thermal conductivity coefficient associated with copper.

8. The invention as defined in claim 7, wherein said center conductor and outer conductor of said coaxial line comprise the metal stainless steel.

9. The invention as defined in claim 7, wherein said coaxial line possesses a flexibility characteristic and is pliant in characteristic.

10. The invention as defined in claim 1, wherein said first pedestal means includes an upper surface area at least as large in size as the surface area of said high frequency electronic superconductor apparatus.

11. The invention as defined in claim 1, wherein each of said first and second pedestals is comprised of aluminum.

12. The invention as defined in claim 1, wherein said first predetermined height of said first pedestal means and said second predetermined height of said second pedestal means are identical in height.

13. The invention as defined in claim 1, wherein said first pedestal means comprises a rectangular block in geometry; wherein said second pedestal means comprises a rectangular block in geometry; and wherein said second pedestal means is of a size larger than said first pedestal means.

14. The invention as defined in claim 1, wherein one of said side walls of said first container means is equal to or greater in length than any other of said side walls and is of a length L; wherein said side walls of said third container means are spaced from corresponding side walls of said first container means to define two pairs of confronting side walls; wherein the confronting side walls in one of said two pairs of confronting side walls are spaced apart by a distance D, said distance D being no smaller than the spacing between any of the confronting side walls in any other of said two pairs of confronting side walls; and wherein a ratio of said length L to said distance D is less than 20; whereby said pairs of nested containers define cascaded magnetic shields.

15. The invention as defined in claim 1, wherein said first electrically shielded electrical transmission line lead means comprises a microwave strip line.

16. The invention as defined in claim 15, wherein said microwave strip line comprises: an electrically conductive ribbon of predetermined width encased in a shallow rectangular shaped dielectric medium; a pair of conductive ribbons of a second predetermined width, said ribbons being located on opposite sides of and integrally connected to said rectangular shaped dielectric medium; and wherein said second predetermined width being substantially greater than said first predetermined width; and wherein said ribbons and dielectric medium possess a thermal conduction characteristic less than the thermal conduction characteristic associated with copper.

17. The invention as defined in claim 15 wherein said microwave strip line is pliant in characteristic.

18. The invention as defined in claim 16 wherein said microwave strip line is pliant in characteristic.

19. The invention as defined in claim 1, wherein said cryogenic cooler means comprises:
  a plate of thermally conductive material, said plate having a surface that mates with the underside of said end wall of said third open-ended container means for providing a thermally conductive path there between.

20. The invention as defined in claim 1, wherein said first and second electrically shielded electrical transmission line lead support said end wall of said fourth open-ended container means in elevated position over said side walls of said third open-ended container means.

21. The invention as defined in claim 1, wherein said first electrically shielded electrical transmission line lead means is in contact with said first pedestal means for conducting heat introduced into said first region by said first electrically shielded electrical transmission line lead means to said cryogenic cooler means.

22. Apparatus for magnetically shielding cryogenic high frequency electronic superconductor apparatus within a cryogenic environment isolated from exposure to stray magnetic flux originating external of said housing, said cryogenic high frequency electronic superconductor apparatus requiring input of high frequency signals from an external source and output of high frequency signals to an external sink, comprising:

first open-ended container means having a predetermined geometry and a first predetermined size, side walls, an end wall integrally joined to said side walls and an open end located opposite said end wall;

first pedestal means of a first predetermined height for seating said high frequency electronic superconductor apparatus in spaced relationship to said end wall of said first open-ended container means;

said first pedestal means being located inside of said first open-ended container means and seated atop said end wall thereof in spaced relationship to said side walls thereof;

said first pedestal means being comprised of a thermally conductive metal for providing a thermal conducting path between said high frequency electronic superconductor apparatus and said end wall of said first open ended container means;

second open-ended container means having said predetermined geometry of said first open-ended container means and being of a second predetermined size, side walls, an end wall integrally joined to said side walls thereof, and an open end located opposite said end wall thereof; said second predetermined size being smaller than said predetermined size of said first open-ended container means;

said second open-ended container means being nested within said first open-ended container means and in spaced relationship thereto to define therewith a first housing member for enclosing and magnetically shielding said high frequency electronic superconductor apparatus and defining a slight clearance space between said first and second open-ended container means;

said side walls of said second open-ended container means being received within said first open-ended container means and said side walls of said first open-ended container means covering and spaced from said side walls of said second open-ended container means;

third open-ended container means having a predetermined geometry and third predetermined size, side walls, an end wall integrally joined to said side walls thereof, and an open end located opposite said end wall thereof;

said third predetermined size of said third open-ended container means being larger than said first predetermined size of said first open-ended container means;

second pedestal means of a second predetermined height for supporting said end wall of said first open-ended container means on and in spaced relationship to said end wall of said third open-ended container means, said second pedestal means being in contact with an underside of said first open-ended container means end wall, on a side opposite to said end wall side on which said first pedestal means is seated;

said second pedestal means being located inside said third open-ended container means, and being seated atop said end wall thereof and in spaced relationship to said side walls of said third open-ended container means;

said second pedestal means being comprised of a thermally conductive metal for providing a thermal conducting path between said end wall of said first open-ended container means and said end wall of said third open-ended container means;

fourth open-ended container means having said predetermined geometry of said third open-ended container means and a fourth predetermined size, side walls, an end wall integrally joined to said side walls thereof and an open end located opposite said end wall thereof;

said fourth predetermined size of said fourth open-ended container means being larger than said third predetermined size of said third open-ended container means, wherein said fourth open-ended container means fits over said third open-ended container means;

said fourth open-ended container means being oriented in inverted position in overlying nested relationship with said third open-ended container means to define a second housing member for enclosing and magnetically shielding said first housing member and defining a slight clearance space between said fourth and third open-ended container means;

said side walls of said fourth open-ended container means covering at least a portion of and spaced from said side walls of said third open-ended container means;

cryogenic cooling means having a cryogenic temperature providing a thermal conducting path to an underside of said end wall of said third open-ended container means for withdrawing heat there through, whereby said high frequency electronic superconductor apparatus is maintained at cryogenic temperatures through heat withdrawn through said first pedestal, said end wall of said first open-ended container means, said second pedestal and said end wall of said third open-ended container means;

each of said first, second, third and fourth open-ended container means being comprised of a mu-metal, said mu-metal having high magnetic permeability characteristic and being thermally conductive, whereby said second housing member magnetically shields said first housing member from any stray magnetic fields external of said second housing member and said first housing member magnetically shields said high frequency electronic superconductor apparatus from stray magnetic fields external of said first housing member to thereby define cascaded magnetic shields;

first electrically shielded electrical transmission line lead means for propagating high frequency signals between said electronic circuit means and an external source of high frequency signals;

said first electrically shielded electrical transmission line lead means comprises first and second electrical conductors having a thermal conductivity coefficient that is less than the thermal conductivity coefficient associated with-copper and a dielectric material having a low thermal conductivity characteristic for insulating said electrical conductors from one another;

said first electrically shielded electrical transmission line lead means defining a serpentine path extending from outside said second housing member from the end wall of said third open-ended container means along an outer surface of a side wall of said third open-ended container means, and into said clearance space between said side wall of said third open-ended container means and said fourth open-ended container means, over said open end of said third open-ended container means and through a clearance space between said third open-ended container means and said first open-ended container means, and down along said clearance space between said side walls of said first and second open-ended container means, and along said end wall of said first open-ended container means; and then into said open end of said second open-ended container means and up along side of said first pedestal means to said cryogenic high frequency electronic superconductor apparatus; whereby high frequency signals are coupled between said high frequency electronic superconductor apparatus and a location external of said second housing member without adversely affecting the magnetic shielding and without introducing significant heat to the vicinity of said high frequency electronic superconductor apparatus from locations external of said second housing member;

second electrically shielded electrical transmission line lead means for propagating high frequency signals between said high frequency electronic superconductor apparatus and an external source of high frequency signals;

said second electrically shielded electrical transmission line lead means being located on a side of said third open-ended container means opposite to the side at which said first electrical transmission line lead means is located;

said second electrically shielded electrical transmission line lead means comprising electrical conductors having a thermal conductivity coefficient that is less than the thermal conductivity coefficient associated with copper and dielectric material having a low thermal conductivity characteristic insulating said electrical conductors;

said second electrically shielded electrical transmission line lead means being shaped into a serpentine path extending from outside said second housing member, from the end wall of said third open-ended container means along an outer surface of a side wall of said third open-ended container means, and into said clearance space between said side wall of said third open-ended container means and said fourth open-ended container means, over said open end of said third open-ended container means and a clearance space between said third open-ended container means and said first open-ended container means, and down along said clearance space between said side walls of said first and second open-ended container means, and along said end wall of said first open-ended container means; and then along said first pedestal means into said open end of said second open-ended container means and to said high frequency electronic superconductor apparatus; whereby high frequency signals are coupled from said high frequency electronic superconductor apparatus and propagates to a location external of said second housing member without adversely affecting the magnetic shielding and without conducting significant heat from locations external of said second housing member to the vicinity of said high frequency electronic superconductor apparatus;

wherein one of said side walls of said first container means is equal to or greater in length than any other of said side walls and is of a length L; wherein said side walls of said third container means are spaced from corresponding side walls of said first container means to define four pairs of confronting side walls; wherein the confronting side walls in one of said four pairs of confronting side walls are spaced apart by a distance D, said distance D being no smaller than the spacing between any of the confronting walls in any other of said four pairs of confronting side walls; and wherein a ratio of said length L to said distance D is less than 20; whereby said pairs of nested containers define cascaded magnetic shields; and said cryogenic cooler means comprising:
a plate of thermally conductive material, said plate having a surface that mates with the underside of said end wall of said third open-ended container means for providing a thermally conductive path there between.

23. Apparatus for housing cryogenic high frequency electronic superconductor apparatus at cryogenic temperatures in an environment isolated from exposure to stray magnetic fields existing external of said housing, comprising:

first and second pairs of nested box like magnetic shielding members comprised of high permeability magnetic material, each of said pairs being comprised of one shielding member oriented in inverted relationship relative to the other shielding member to define an enclosed region, whereby said first pair of shielding members defines a first enclosed region and said second pair of shielding members defines a second enclosed region;

said first pair of nested box like magnetic shielding members being housed within said second region in spaced relationship to said second pair of shielding members;

first thermally conductive pedestal means located within said second region for spacing said first pair of nested box like magnetic shielding members from said second pair of shielding members and defining a thermally conductive path between said first and second pair of shielding members;

second thermally conductive pedestal means located within said first region for supporting said high frequency electronic superconductor apparatus in spaced relation to said first pair of shielding members and defining a thermally conductive path between said high frequency electronic superconductor apparatus and said first pair of magnetic shielding members;

electrically shielded electrical transmission line lead means having a thermal conductivity less than the thermal conductivity associated with copper for propagating RF signals;

said electrically shielded electrical transmission line lead means extending from outside said second region and along a clearance space defined between said shielding members of said second pair of shielding members, and into said second region, and along another clearance space defined between said shielding members of said first pair of shielding members into said first region, and along side said first thermally conductive pedestal means to said high frequency electronic superconductor apparatus.

24. The invention as defined in claim 23, wherein said electrically shielded electrical transmission line lead means is pliant in characteristic.

25. The invention as defined in claim 23, wherein said electrically shielded electrical transmission line lead means comprises a microwave strip line.

26. The invention as defined in claim 23, wherein said electrically shielded electrical transmission line lead means comprises a coaxial line.

* * * * *